United States Patent [19]
Akimoto

[11] Patent Number: 5,868,865
[45] Date of Patent: Feb. 9, 1999

[54] APPARATUS AND METHOD FOR WASHING TREATMENT

[75] Inventor: Masami Akimoto, Kumamoto, Japan

[73] Assignee: Tokyo Electron Limited, Tokyo, Japan

[21] Appl. No.: 672,037

[22] Filed: Jun. 26, 1996

[30] Foreign Application Priority Data

Jun. 27, 1995 [JP] Japan ................................ 7-183537

[51] Int. Cl.⁶ .............................. B08B 3/10; B08B 7/00; C23G 1/02
[52] U.S. Cl. .................................. 134/33; 134/3; 134/32; 134/61
[58] Field of Search ............................. 134/2, 3, 32, 33, 134/902, 153, 61

[56] References Cited

U.S. PATENT DOCUMENTS

| | | | |
|---|---|---|---|
| 4,827,867 | 5/1989 | Takei et al. ................................. | 118/64 |
| 5,020,200 | 6/1991 | Mimisaka et al. ....................... | 29/25.01 |
| 5,348,893 | 9/1994 | Yamagishi ................................. | 437/10 |
| 5,395,482 | 3/1995 | Onda et al. .............................. | 156/646 |

FOREIGN PATENT DOCUMENTS

0 273 628   7/1988   European Pat. Off. .

*Primary Examiner*—Marian C. Knode
*Assistant Examiner*—Brenda G. Brumback
*Attorney, Agent, or Firm*—Oblon, Spivak, McClelland, Maier & Neustadt, P.C.

[57] ABSTRACT

Disclosed is an apparatus for washing treatment which comprises a washing solution supply source filled with a washing solution required for chemical washing of a wafer, a spin chuck for rotatably holding a wafer to be treated, a nozzle communicating with the washing solution supply source, for supplying a washing solution from the washing solution supply source onto the wafer held on the spin chuck, temperature controlling device for controlling the temperature of the washing solution to be supplied to the wafer from the nozzle, and a temperature controlled cover closely provided so as to cover the wafer held on the spin chuck, for preventing a substantial temperature variation of the washing solution present on the wafer.

17 Claims, 9 Drawing Sheets

APPARATUS AND METHOD FOR WASHING TREATMENT

BACKGROUND OF THE INVENTION

1. Field of the Invention

The present invention relates to an apparatus and a method for washing substrates such as semiconductor wafers and glass substrates for LCDs.

2. Description of the Related Art

In the manufacturing of semiconductor devices, a washing treatment apparatus is employed for removing particles, organic contaminants, metallic impurities and the like from the surfaces of semiconductor wafers by using ammonia, hydrofluoric acid, pure water and the like. In a one-by-one washing treatment apparatus, for example, the surface of a wafer is washed with chemical solutions such as an aqueous ammonia solution and an aqueous hydrofluoric acid solution, and then washed with pure water. In the one-by-one washing treatment apparatus, a wafer is horizontally held by a spin chuck and an aqueous ammonia solution or an aqueous hydrofluoric acid is supplied to a wafer for a predetermined time so as to cover it up.

However, in conventional washing treatment apparatuses, as the temperature of the chemical solution decreases, the reaction rate of the chemical washing (chemical cleaning) reduces. As a result, in some cases, sufficient washing performance is not obtained. To circumvent this, it is conceivable that the supply amount of the chemical solution is increased to make up for the insufficient washing performance. However, the large consumption of the chemical solution required in this method offers a problem in that a treatment cost is inevitably increased.

Furthermore, in the case where an alkaline solution is used together with an acidic solution in the conventional washing treatment apparatuses, the alkaline washing component used in a previous step is brought into the next acidic washing step, together with a wafer. As a result, the washing efficiency decreases.

SUMMARY OF THE INVENTION

An object of the present invention is to provide a washing treatment apparatus capable of reducing the amount of a chemical solution for washing a substrate and capable of improving the throughput and yield of products.

A washing treatment apparatus of the present invention comprises: a washing solution supply source filled with a washing solution required for chemical washing of a substrate; a spin chuck for rotatably holding a substrate to be treated; a nozzle communicating with the washing solution supply source, for supplying the washing solution from the washing solution supply source onto the substrate held on the spin chuck; temperature controlling means for controlling the temperature of the washing solution to be supplied to the substrate from the nozzle; and a temperature controlled cover closely provided so as to cover the substrate held on the spin chuck, for preventing a substantial temperature variation of the washing solution present on the substrate.

Another washing treatment apparatus of the present invention comprises: a spin chuck for rotatably holding a substrate to be treated; a first washing treatment section having first washing solution supply means filled with a first washing solution for chemical washing of a substrate; a second washing treatment section having second washing solution supply means filled with a second washing solution different from the first washing solution; and transfer means for transferring the substrate above the spin chuck and passing the substrate between the spin chuck and the transfer means, wherein a path for transferring the transfer means is provided between the first washing treatment section and the second washing treatment section, and the first washing treatment section is spaced apart from the second washing treatment section by the path.

The method for washing treatment of the present invention comprises: (a) rotatably holding a substrate onto a spin chuck; (b) placing a temperature controlled cover relatively adjacent to the substrate so as to cover the substrate held on the spin chuck; (c) supplying a washing solution having substantially the same temperature as that of the temperature controlled cover, to the substrate held on the spin chuck, thereby chemically washing the substrate with the washing solution; and (d) relatively separating the substrate held on the spin chuck from the temperature controlled cover.

According to the washing treatment apparatus of the present invention, the temperature controlled cover is closely placed so as to cover the substrate held on the spin chuck. The washing solution covering the substrate is therefore substantially free from a temperature change. By virtue of this, a desired washing treatment can be performed, using a constant amount of the washing solution in a constant time period.

Moreover, according to the washing treatment apparatus of the present invention, the alkaline treatment atmosphere of a first washing treatment section is spaced apart from the acidic treatment atmosphere of a second washing treatment section by a transfer path. Therefore, it is possible to prevent a different-type atmosphere from entering into each of the washing treatment steps, without fail.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Hereinbelow, the preferred embodiments of the present invention will be explained with reference to the accompanying drawings. We will first explain the case in which the present invention is adopted to a washing treatment system for a semiconductor wafer.

Figure 1:
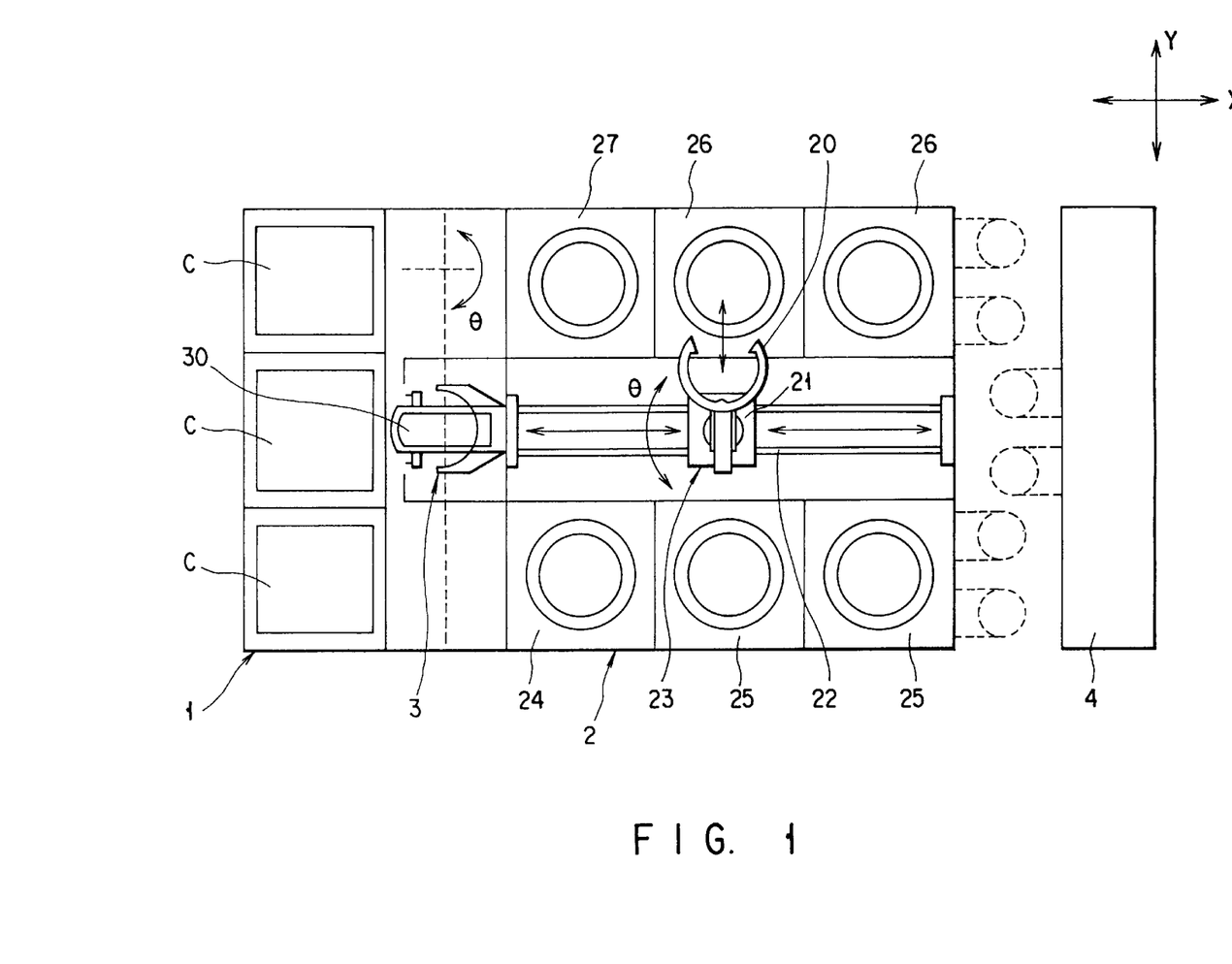
FIG. 1 is a plan view schematically showing an entire washing treatment system for a semiconductor wafer.

As shown in FIG. 1, the washing treatment system comprises a carrying in/out section 1, a process section 2, a wafer transfer section 3, and a washing solution supply box 4. On the stage of the carrying in/out section 1, a plurality of cassettes C are mounted. In a cassette C, 25 sheets of untreated semiconductor wafers W are housed. The process section 2 has a plurality of process units 24, 25, 26, and 27 for use in washing wafers W, and a main arm 20 movably provided to a center path 22 thereof.

The wafer transfer section 3 is interposed between the carrying in/out section 1 and the process section 2. To section 3, a support arm 30 is further provided. The support arm 30 has a moving mechanism movable along the X-, Y-, and Z-axes (not shown) and a θ rotation mechanism (not shown) and plays a role in taking out a wafer W from the cassette C and transferring it to the main arm 20. The main arm 20 has a moving mechanism 23 movable along the X-, Y-, and Z-axes and a θ-rotation mechanism 21 and plays a role in receiving the wafer W from the support arm 30 and carrying in and out from each of process units 24 to 27.

The washing solution supply box 4 comprises tanks for chemical solutions and a rinse solution to be used in individual process units 24 to 27. Chemical solution tanks 102 respectively contain an aqueous solution of ammonia hydrogen peroxide, a diluted aqueous solution of hydrofludric acid, a diluted aqueous solution of hydrochloric acid and the like. In a rinse solution tank 104, pure water is contained.

On one side of the center path 22, a rear surface washing unit 24 and two washing treatment units 25 (hereinafter, referred to as "first washing treatment section") are juxtaposed. The rear surface washing unit 24 is used for washing the rear surface of the wafer W. In the first washing treatment section 25, the surface of the wafer W is washed with an alkaline washing solution. On the other side of the center path 22, two washing treatment units 26 (hereinafter, referred to as "second washing treatment section") and washing/drying treatment section 27 are placed side-by-side. The second washing treatment section 26 is used for washing a surface of the wafer W with an acidic washing solution. The washing/drying treatment section 27 is used for a final washing and subsequent drying of the wafer W.

The first washing treatment section 25 and the second washing treatment section 26 have substantially the same structure. Hence, we will explain the first washing treatment section 25, alone, hereinbelow.

Figure 2:
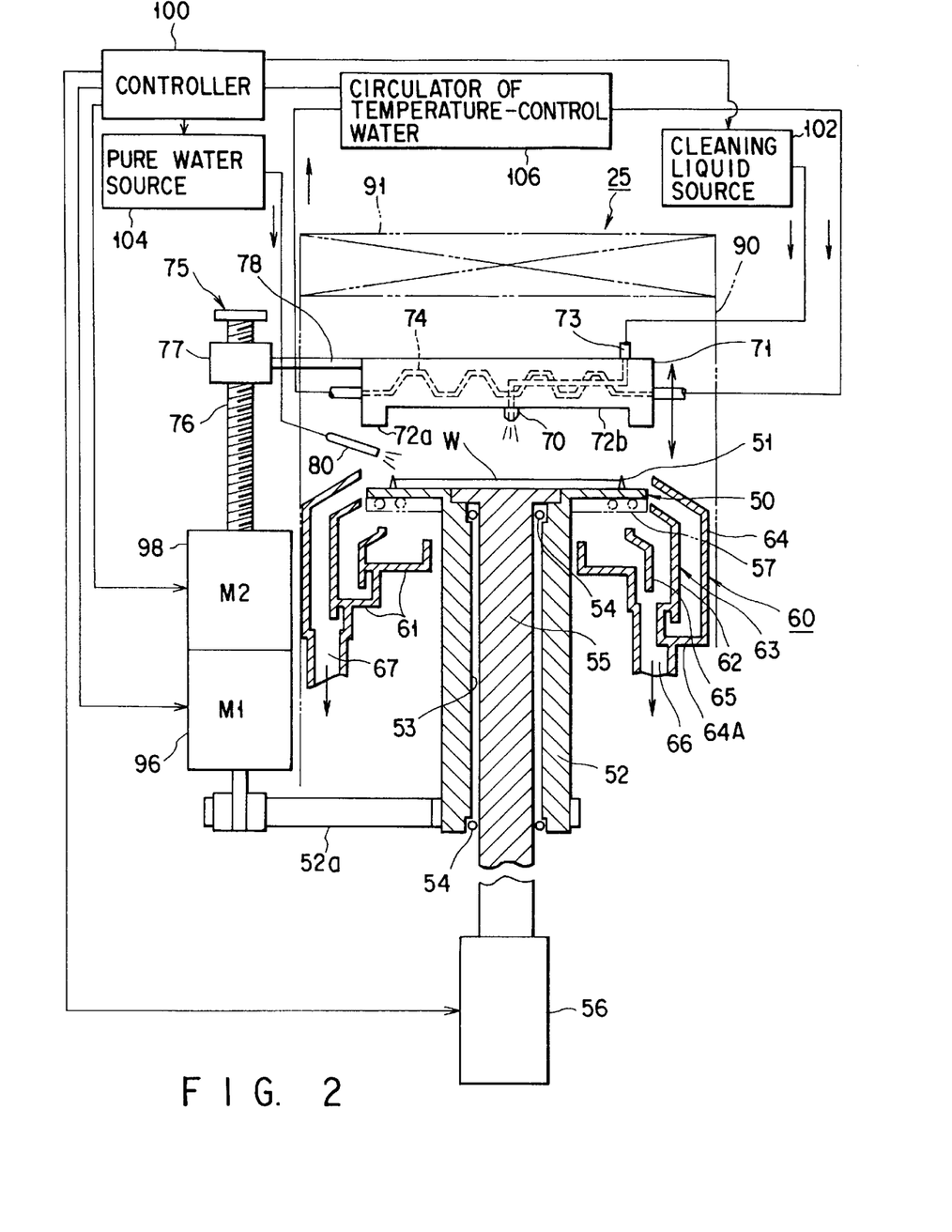
FIG. 2 is a sectional block diagram, partially cut away, showing the apparatus for washing treatment according to an embodiment of the present invention.

As shown in FIG. 2, the first washing treatment section 25 comprises a spin chuck 50, a cup 60, a washing solution supply nozzle (first washing solution supply means) 70, and a temperature controlled cover 71. Between a main chuck body 52 of the spin chuck 50 and the driving pulley of a motor 96, a timing belt 52a is spanned to rotate the main chuck body 52. On the lower side of the holding surface of the main chuck body 52, a passage 57 is formed. The wafer W and the washing solution can be maintained at a predetermined temperature by circulating a heat exchange medium through the passage 57.

The first washing treatment section 25 is provided in a container 90. Purified air is supplied to the container 90 through a filter 91 provided at the ceiling portion thereof and discharged from the bottom.

Figure 3:
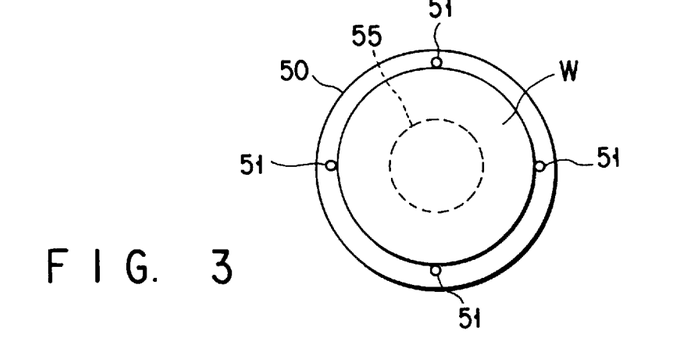
FIG. 3 is a plan view showing a spin chuck adsorptively holding a wafer.

As shown in FIG. 3, to the upper surface of the main chuck body 52, a plurality of wafer holding pawls 51 are provided to hold the wafer W so as not to shift it into position. To a hollow portion 53 of the main chuck body 52, a lifter 55 is inserted. The lifter 55, which is connected to a rod of a cylinder 56, is used for lifting the wafer W from the surface of the main chuck body 52. Between the lifter 55 and the main chuck body 52, a seal bearing 54 is provided.

The cup 60 is provided so as to surround the lower portion and side portion of the spin chuck 50 so as to receive a used washing solution. The cup 60 comprises a bottom portion 61 which is positioned below the spin chuck 50, an inner cup 63, and an outer cup 64. The wall of the inner cup 63 is vertically extended from the bottom 61 to close proximity of the lower side of the holding surface of the spin chuck 50. The outer cup 64 is formed outside of the inner cup 63 in the form of a ring and the upper end thereof extends to close proximity of the upper holding surface of the spin chuck 50. In the interior of the inner cup 63, a ring-form divider wall 65 extending from the bottom 61 is provided. To the bottom 61 of the outer periphery side of the inner cup 63, a drain 66 is provided. To the bottom 64A of the outer cup 64, a drain 67 is provided. By way of the drain 66, the used washing solution is withdrawn from the inner cup 63 to a regeneration device (not shown). The recovered washing solution is converted to a reusable solution after impurities are removed therefrom in the regeneration device. The used rinse solution is designed to be discharged from the outer cup 64 by way of the drain 67.

The washing solution nozzle 70 is provided at the lower center of the temperature controlled cover 71. The nozzle 70 is communicated with the washing solution supply source 102 by way of a pipe 73. The washing solution supply source 102 is provided in the washing solution supply box 4 and communicated with the regeneration device mentioned above.

The temperature controlled cover 71 is supported in a vertically movable manner by an elevating mechanism 75. The elevating mechanism 75 comprises a ball nut 77 connected to the temperature controlled cover 71 via a bracket 78, a ball screw 76 with which the nut 77 is engaged, and a motor 98 for rotating the screw 76. Incidentally, in place of the elevating mechanism 75, a reciprocally movable mechanism having a cylinder may be used.

In the temperature controlled cover 71, a heat exchange passage 74 is formed. The heat exchange passage 74 is communicated with a temperature-controlled water circulation device 106 and thus water set to a predetermined temperature is circulated through the passage 74. The power of the heater for the temperature controlled water circulation device 106 is connected to a controller 100 and thus the temperature-controlled water is controlled to have a temperature in the range of 60° C. to 90° C. by the temperature-controlled water circulation device 106. In place of the heat exchange passage 74, and the temperature-controlled water circulation device 106, a built-in heater may be used to heat the cover 71.

A lower peripheral portion 72a of the temperature controlled cover 71 downwardly projects to a position lower than a center portion 72b thereof. When the temperature controlled cover 71 is moved downward to make closer to the wafer W, a predetermined space is formed for use in controlling temperature between them.

At the portion off to the upper right of the pin chuck 50, a rinse nozzle 80 is provided. The rinse nozzle 80 is communicated with a pure water supply source 104, thereby supplying pure water to the wafer W held on the spin chuck 50. The rinse nozzle 80 is provided so as to move between a home position and a spray position. The used rinse solution is designed to be downwardly discharged by way of the drain 67 of the cup 60.

Figure 12:
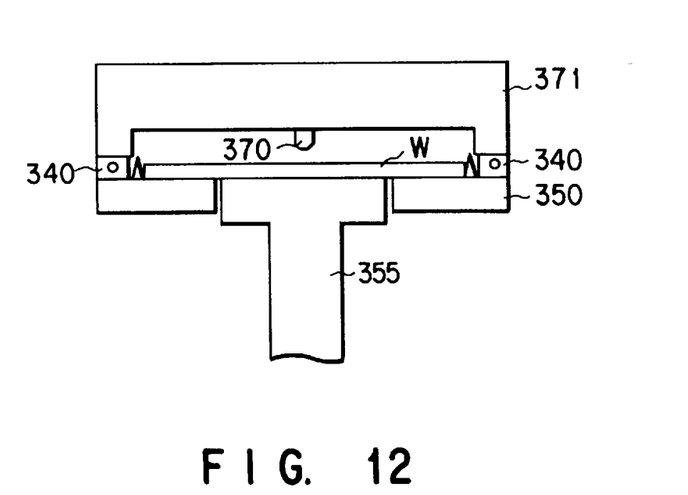
FIG. 12 is a perspective view showing a spin chuck/cover assembly of another embodiment.

In the meantime, the lower peripheral portion 72a of the temperature controlled cover 71 can be contacted with the spin chuck 50 by interposing a seal bearing 340 between the spin chuck 50 and the temperature controlled cover 71, as shown in FIG. 12.

Hereinbelow, we will explain the case in which the wafer W is washed in the first washing treatment section 25 with reference to FIGS. 4A to 4D.

Figure 4A:
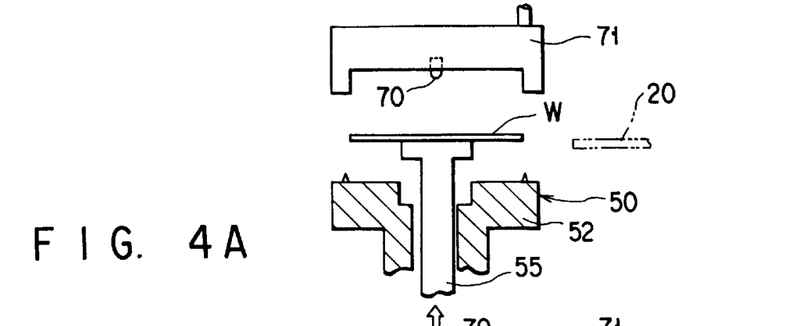
FIGS. 4A to 4D are cross-sectional views schematically showing a spin chuck assembly, a cover assembly, a support arm, and the like, for explaining the washing treatment method according to an embodiment of the present invention.

As shown in FIG. 4A, while the temperature controlled cover 71 is being maintained over the lifter 55 in a stand-by state, the lifter 55 is moved upward in such a way that the upper surface of the lifter 55 is positioned higher than the surface of the spin chuck 50. Then, the wafer W is transferred to the lifter 55, from the main arm 20. Subsequently, the lifter 55 is moved downward to place wafer W securely on the upper surface of the spin chuck 50.

Figure 4B:
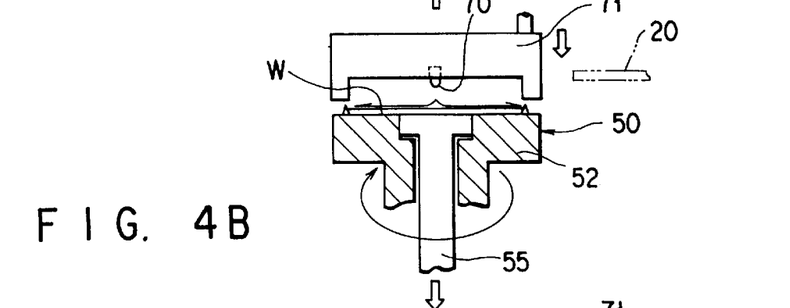

The temperature controlled cover 71 is then moved downward to form a space between the temperature controlled cover 71 and the spin chuck 50 for controlling temperature, as shown in FIG. 4B. While this state is being maintained, an aqueous ammonia solution is supplied to the wafer W from the washing solution supply nozzle 70. At this point, the spin chuck 50 is allowed to stand or to rotate in such a way that the aqueous ammonia solution covers the surface of wafer. The temperature of the aqueous ammonia solution is controlled in the range of 60° C. to 90° C. While kept in this state for a predetermined time, the wafer W is chemically washed with the aqueous ammonia solution. Furthermore, the temperature of the washing solution can be stabilized by providing the temperature controlling mechanisms 57 to the spin chuck 50.

Figure 4C:
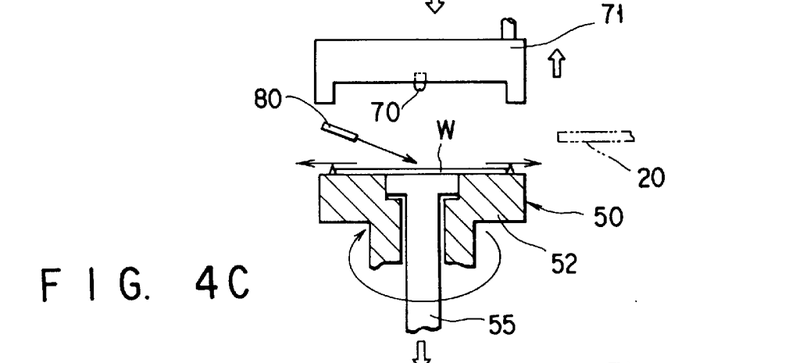
Figure 4D:
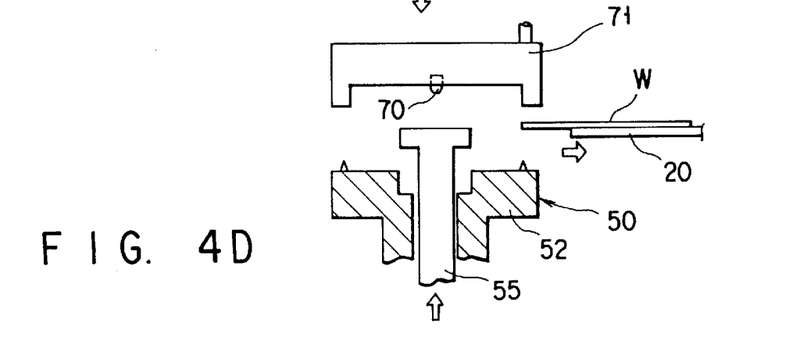

After washing, the temperature controlled cover 71 is moved upward and then pure water is supplied to the wafer W from the rinse nozzle 80, as shown in FIG. 4C, and simultaneously the spin chuck 50 is rotated at high speed. In this way, the aqueous ammonia solution is centrifugally removed from the wafer W. After the wafer W is washed by supplying pure water for a predetermined time, the pure water supply is terminated but the rotation of the spin chuck 50 alone is continued, thereby drying the wafer W. Thereafter, the rotation of the spin chuck 50 is terminated and the lifter 55 is moved up, as shown in FIG. 4 and then, the wafer W is passed to the main arm 20 and transferred to the next step.

In the second washing treatment section 26, an aqueous hydrofluoric acid solution is used instead of an aqueous ammonia solution. The second washing treatment section 26 has substantially the same structure of the first washing treatment section 25.

Between the first section 25 and the second section 26, a path 22 is provided. Since the first section 25 having an alkaline atmosphere is spaced apart from the second section having an acidic atmosphere, it is possible to prevent the alkaline atmosphere from entering into the second section 26 when acidic washing is performed.

Figure 5:
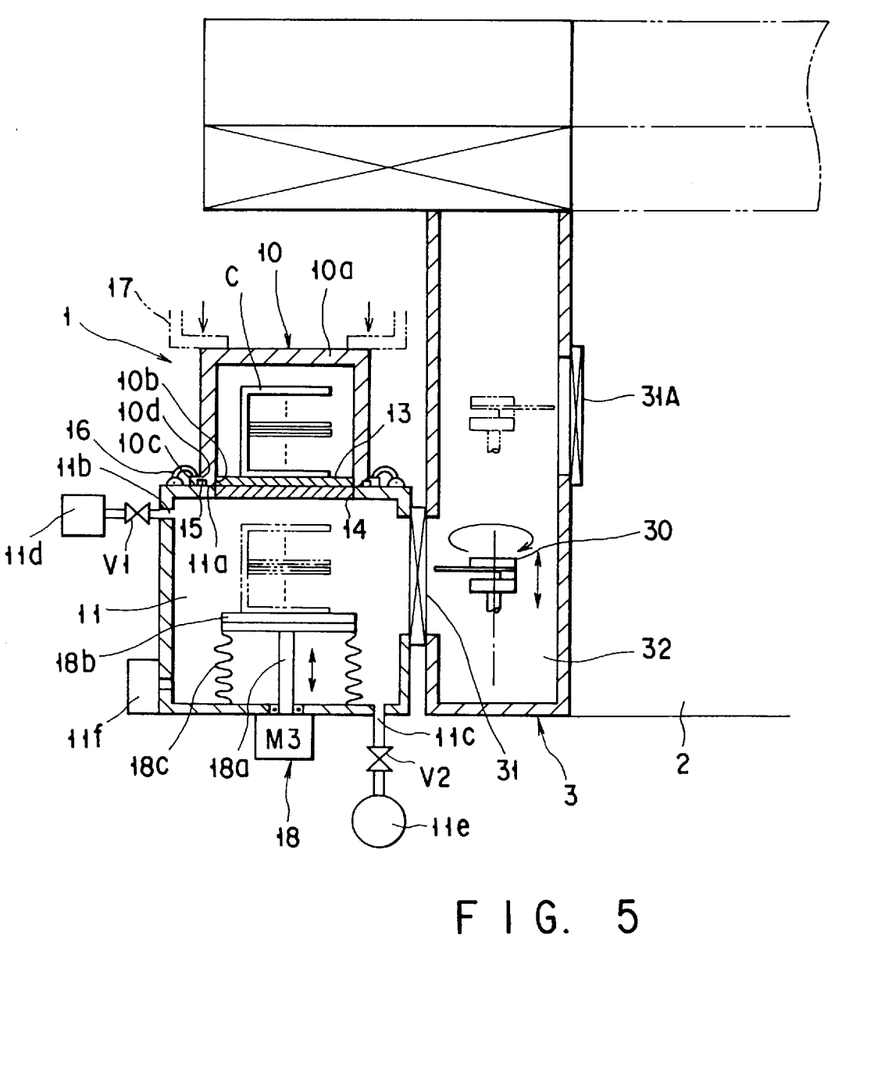
FIG. 5 is a cross-sectional view schematically showing a carrying in/out section and a wafer transferring section.

Hereinbelow, the operations of the carrying in/out section 1 and wafer transfer section 3 will be explained referring to FIG. 5.

In the carrying in/out section 1, a container 10 is provided for use in carrying in and out the cassette C. The container 10 is positioned right above an airtight chamber 11. In the airtight chamber 11, an elevating mechanism 18 for transferring the cassette C is provided. At the upper portion of the mechanism 18, the stage 18b is provided on which the cassette C is mounted. The airtight chamber 11 is communicated with the wafer transferring portion 3 by way of a gate valve 31.

A container main body 10a having a lower opening 10b, is a box made of a hard plastic or a metal such as stainless steel or aluminum. To the lower opening 10b, a cover 13 is openably provided. In the container 10, a cassette C is mounted on a cover 13. The cassette C can be stored in an airtight condition by closing the cover 13 of the container 10. The container 10 has an inner atmosphere such as an $N_2$ gas. The interior is set at normal pressure or kept in a pressurized condition slightly higher than the normal pressure, e.g., 0.05 Torr or more. Incidentally, the cassette C is immobilized by pressure onto the container 10 by means of an airtight-sealed holding member (not shown) with an operation nob. The immobilized cassette C is liberated by releasing the pressure of the holding member.

To the lower portion of the main body 10a of the container, a flange 10c is outwardly provided. To the lower surface of the flange 10c, a groove 10d is formed. Within the groove 10d, an O-ring 15 is provided. The cover 13 is fixed in an airtight manner to the flange 10c by means of a rock mechanism, engaging mechanism, or the like (not shown). In this way, the interior of the container 10 can be kept airtight.

When the container 10 is mounted on the top portion of the airtight chamber 11 by transfer means (not shown), the flange 10c is connected to the top of the airtight chamber 11 by a clump 16. In this mechanism, the seal member 15 is fixed tightly to the container 10 and the airtight chamber 11, thereby connecting the container 10 and chamber 11 in an airtight manner. In the meantime, in place of the clump 16, the container 10 may be placed by pressure on the top portion of the airtight chamber 11 by means of a pressurizing member 17 as indicated by a dash-and-two dot-line in FIG. 5.

In the top of the airtight chamber 11, an open window 11a is formed. The open window 11a is opened and closed by means of a shutter 14. On the upper side wall of the airtight chamber 11, a gas supply port 11b is provided. With the gas supply port 11b, an $N_2$ gas supply source 11d is communicated via a valve V1. Moreover, on the bottom portion of the airtight chamber 11, an exhaust vent 11c is opened. With the exhaust vent 11c, a vacuum pump 11e is communicated by way of a valve V2. The airtight chamber 11 is purged by the $N_2$ gas supplied from the $N_2$ gas supply source 11d. The atmosphere of the chamber 11 is set to normal pressure or slight higher than normal pressure, e.g., about 0.05 Torr, which is the same pressure as that of the container 10. Alternatively, the atmosphere is set to a predetermined vacuum, e.g., $1\times10^{-1}$ to $10^{-8}$ Torr by the operation of a vacuum pump 11e. Incidentally, the inner pressure of the airtight chamber 11 is measured by a pressure detector 11f. On the basis of the measurement results, the inner pressure of the airtight chamber 11 is manually or automatically set.

In the airtight chamber 11, an elevating mechanism 18 is provided. The elevating mechanism 18 has a motor M3 and an elevating rod 18a. To the upper portion of the elevating rod 18a, a vertically movable stage is provided. On the other hand, from the stage 18b to the bottom wall of the chamber 11, bellows 18c is extendedly provided. The inner space of the airtight chamber 11 is separated in an airtight manner from the elevating mechanism 18 by means of bellows 18c, so that particles are prevented from entering into the airtight chamber 11 from the elevating mechanism 18.

Hereinbelow, we will explain the manner of transferring the wafer W by the support arm 30 of the wafer transfer section 3, referring to FIGS. 6 to 8, 9A and 9B.

Figure 6:
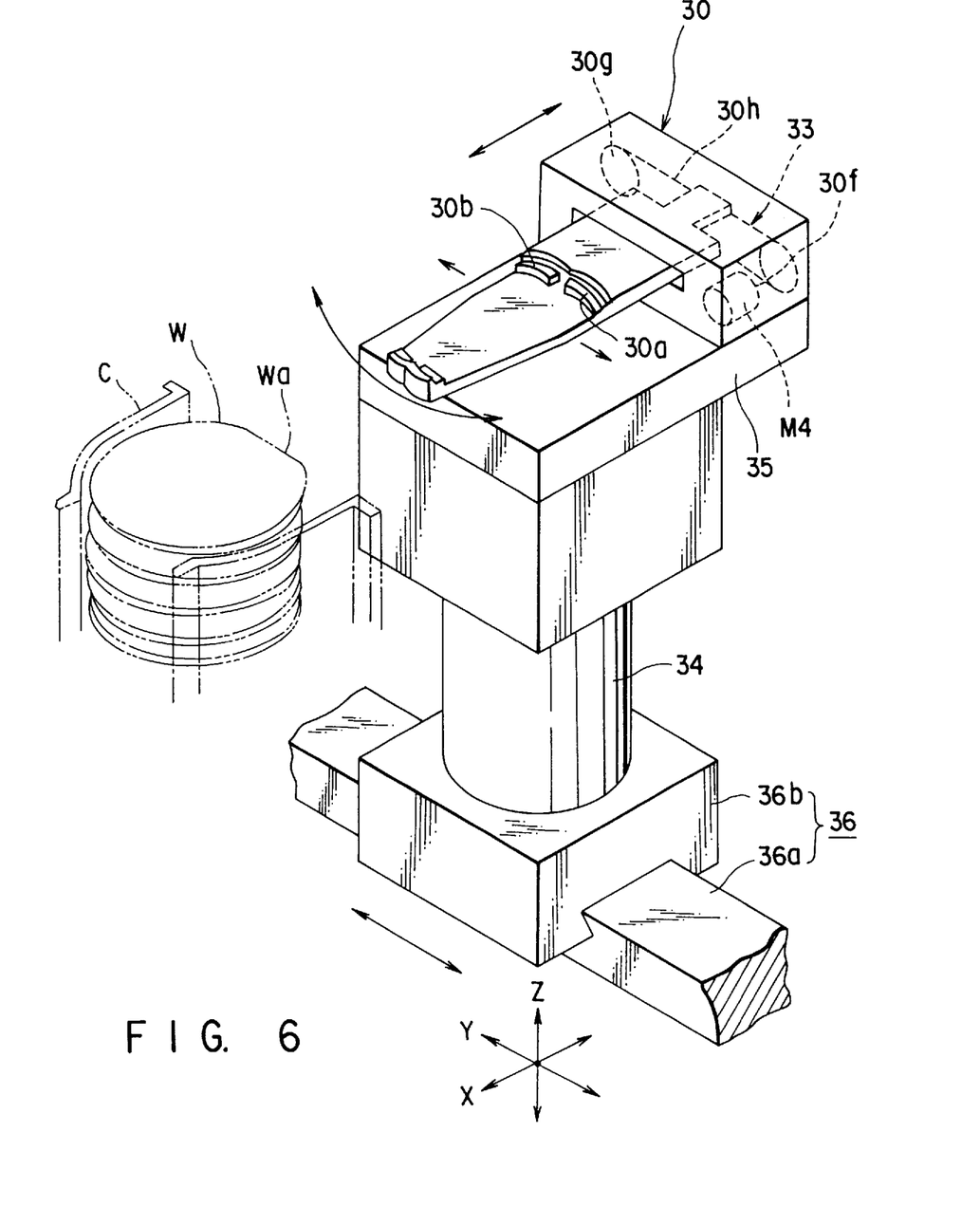
FIG. 6 is a perspective view showing a wafer transferring section provided with a support arm.

The support arm 30 of the wafer transfer section 3 is provided in an airtight chamber 32. The chamber 32 is communicated with a process section 2 by way of an openable shutter 31A. The support arm 30 has two supporting faces 30a and 30b for holding the wafer W. Note that the support arm 30 is made of a heat resistant and corrosion resistant material such as a fluorine-based resin or polyether ketone (PEEK).

As shown in FIGS. 6, 7, 9A and 9B, the support arm 30 is moved in the direction of the Y-axis by a switching mechanism 33, in such a way that the supporting face 30a and 30b are, respectively, moved to respective positions for holding the wafer W, in other words, in such a way that the wafer W is supported by switching from the supporting face 30a (30b) to the supporting face 30b (30a).

The support arm 30 has a vertically movable mechanism 34 capable of moving the support arm 30 vertically in the direction of the Z-axis. In addition, the support arm 30 has a rotation mechanism (not shown), which rotates the support arm 30 around the Z-axis at an angle of θ. The support arm 30 further has an X-axis moving mechanism 35, which moves the support arm 30 in the direction of the X-axis. Still, the support arm has a Y-axis moving mechanism 36, which moves the support arm in the direction of the Y-axis. The Y-axis moving mechanism 36 comprises a guiding rail 36a and a lineally moving bearing 36b.

Figure 7:
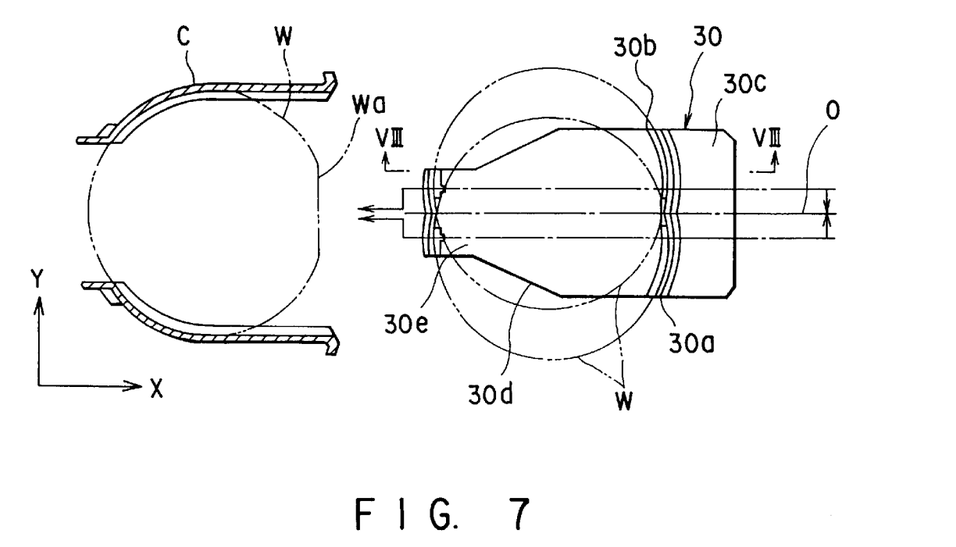
FIG. 7 is a plan view schematically showing a support arm for use in transferring a wafer.

As shown in FIG. 7, the support arm 30 comprises a rectangular proximal end portion 30c, a taper portion 30d, and a distal end portion 30e. The width of the top end portion 30e is narrower than that of the proximal end portion 30c. The supporting faces 30a and 30b are formed symmetrically with respect to a center line O of the support arm 30.

Figure 8:
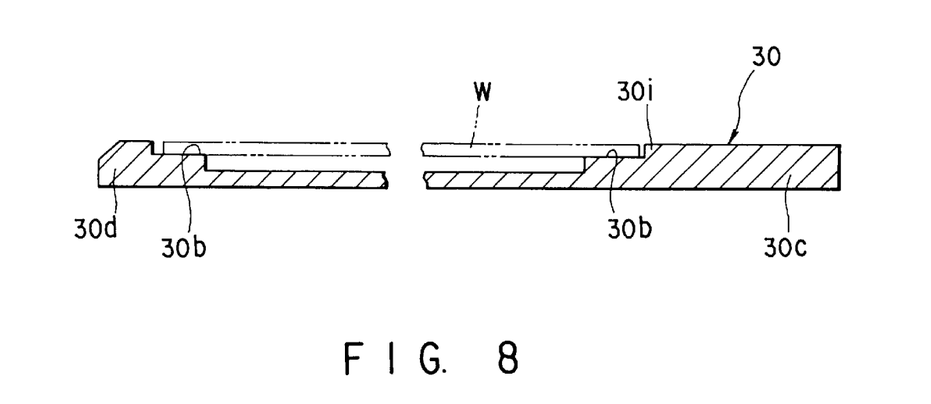
FIG. 8 is a magnified cross-sectional view of a support arm.

As shown in FIG. 8, the support arm 30 comprises arc-form step portions 30i on the sides of the proximal end portion 30c and the distal end portion 30e for defining the end surface of the wafer W, respectively. When the wafer W is supported by one of the supporting faces, 30b, the other surface 30a is not in contact with the wafer W.

Each of supporting faces 30a and 30b is preferably deviated from the center line O by 5 mm or less, and more preferably by 3 mm or less. If a new type wafer W having a positioning notch is used, the widths and lengths of the supporting faces 30a and 30b may be reduced. However, if a conventional wafer W has a flat orientation Wa, the supporting faces 30a and 30b have to be designed to have sufficient widths and lengths so as to support even by the flat orientation Wa. Note that the lateral width of the distal end portion 30e may be the same as that of the proximal end portion 30c.

As shown in FIG. 6, the moving/switching mechanism 33 comprises a stepping motor $M_4$ capable of switching the rotation direction in both ways. To the driving axis of the stepping motor $M_4$, a pulley 30f is provided. Furthermore, a timing belt 30h is spanned between the driving pulley 30f and a follower pulley 30g. To the timing belt 30h, the proximal end portion 30c of the support arm 30 is connected. The support arm 30 is designed to move horizontally in association with the movement of the timing belt 30h. When the support arm 30 is moved horizontally to a wafer transfer section, at which the supporting face of the wafer W is changed from one supporting face 30a (30b) to the other supporting g face 30b (30a). Incidentally, in place of the belt-driving system, a ball-screw mechanism may be employed in the switching mechanism 33.

Hereinbelow, we will explain the case in which the wafer W is taken out from the cassette C by the support arm 30 and then transferred.

Figure 9A:
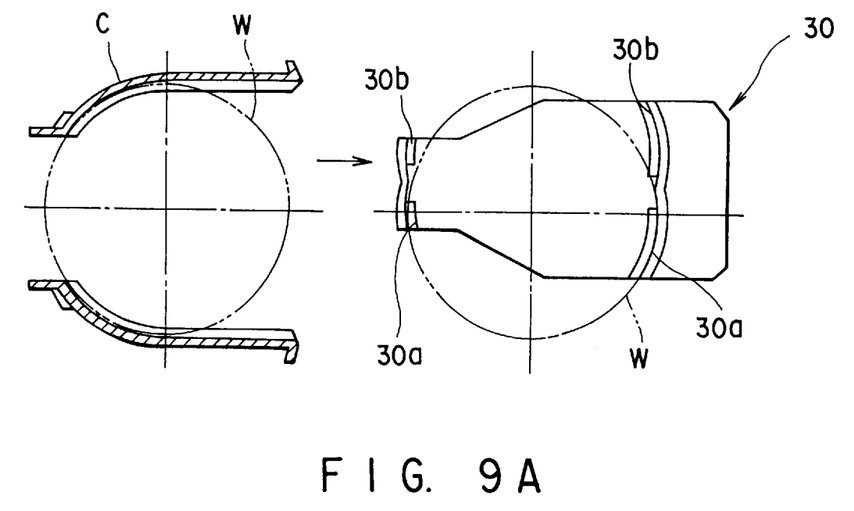
FIGS. 9A and 9B are plan views schematically showing the operation of the support arm in receiving and passing out a substrate, respectively.

As shown in FIG. 7, the center of the support arm 30 is first set to the center of the cassette C. Second, the support arm 30 is moved in the direction of the Y-axis by means of the moving/switching mechanism 33 and positioned in such a way that the center of the supporting arm 30a is on the same line of the center of the cassette C, as shown in FIG. 9A. Third, the support arm 30 is moved forward in the X-axis direction and positioned right under the wafer W in the cassette C. Subsequently, the support arm 30 is moved up to mount the wafer W on the supporting face 30a. Thereafter, the support arm 30 is moved backward in the X-axis direction. In this manner, the wafer W is taken out from the cassette C. The support arm 30 is rotated at an angle of θ to transfer the wafer W from the support arm 30 to the main arm 20.

Figure 9B:
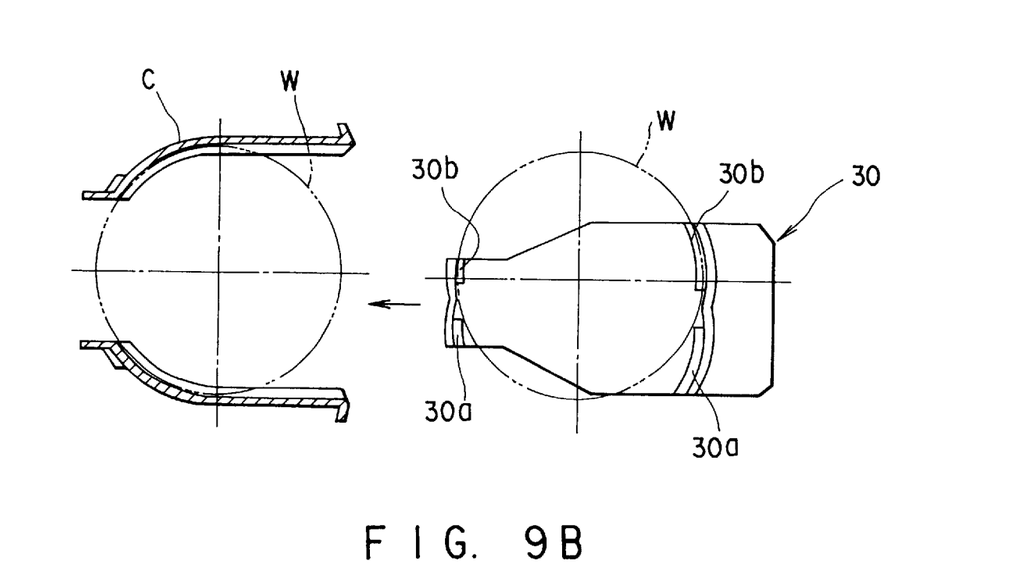

On the other hand, as shown in FIG. 9B, the support arm 30 is moved in the Y-axis direction by the moving/switching mechanism 33 and positioned in such a way that the center of the support surface 30b is on the same line as that of the cassette C. On the supporting face 30b, a washing-completed wafer W is held. The support arm 30 is then moved forward in the X-axis direction to insert a slot groove in the cassette C. Subsequently, the support arm 30 is moved downward to house the wafer W in the cassette C. The support arm 30 is moved backward in the X-axis direction to move the support arm 30 out of the cassette C.

As described above, an untreated wafer W prior to the washing treatment is carried by one of the supporting faces, 30a, on the other hand, a treatment-completed wafer W is carried by the other supporting face, 30b. By virtue of this mechanism, no impurities ascribed to the support arm are attached onto the rear surface of the wafer W. Consequently, contamination of the wafer W is prevented.

Hereinbelow, the operation of washing treatment apparatus will be explained, referring to FIGS. 2, 10 to 13.

The support arm 30 (for example, by the supporting face 30a) receives a predetermined wafer W from the cassette C housing untreated wafers W, which have been carried in the carrying in/out section 1 by use of a carrier robot (not shown). Then the wafer W is transferred to the wafer transfer section 3. The wafer W present in the wafer transfer section 3 is received by a first arm of the main arm 20 placed in the process section 2 by way of a shutter 31A and carried in the rear surface washing section 24 in the process section 2. The wafer W is held by a spin chuck in the rear-surface washing section 24. The rear surface of wafer W is scribed by a washing brush with spinning the wafer W while a washing solution is being supplied. After completion of washing, the wafer W is taken out from the rear-surface washing section 24 by the main arm 20 and carried in the first washing treatment section 25.

As shown in FIG. 2, the wafer W is placed and held on the spin chuck 50. Then, the temperature controlled cover 71 is moved downward to set in close proximity of the wafer W held on the spin chuck 50. While the cover 71 is kept adjacent to the wafer W, the wafer W is rotated at low speed and simultaneously an aqueous ammonia solution is supplied from a nozzle 70 to the wafer W. The supplied aqueous ammonia solution is set to a temperature of about 80° C. In this way, the aqueous ammonia solution used for washing is placed so as to cover the surface of the wafer W. The washing solution dripping from the surface of the wafer W is received by the inner cup 63 and drained via the drain 66.

After the wafer W is covered by the washing solution, the spin chucks rotation is terminated permitting the surface of the wafer W to be washed chemically for a predetermined time. Since the temperatures of both the washing solution and the wafer W are controlled, desired chemical washing results can be obtained.

After washing, the temperature controlled cover 71 is moved off upward and the rinse nozzle 80 is positioned off to the upper right of the wafer W. In this state, the wafer W is rotated while pure water is being applied thereto. The used pure water is received by the outer cup 64 and drained outside via the drain 67. After the wafer W is rinsed for a predetermined time, supply of pure water is terminated. Wafer W is then dried while the wafer W is continuously rotated at high speed.

The wafer thus washed is then taken out from the first washing treatment section 25 by the second arm of the main arm 20 and subsequently transferred to the second washing treatment section 26. Thereafter, the wafer W is transferred from the main arm 20 to a lifter 255 and then the lifter 255 is moved downward to place the wafer W on a spin chuck 250.

Figure 10:
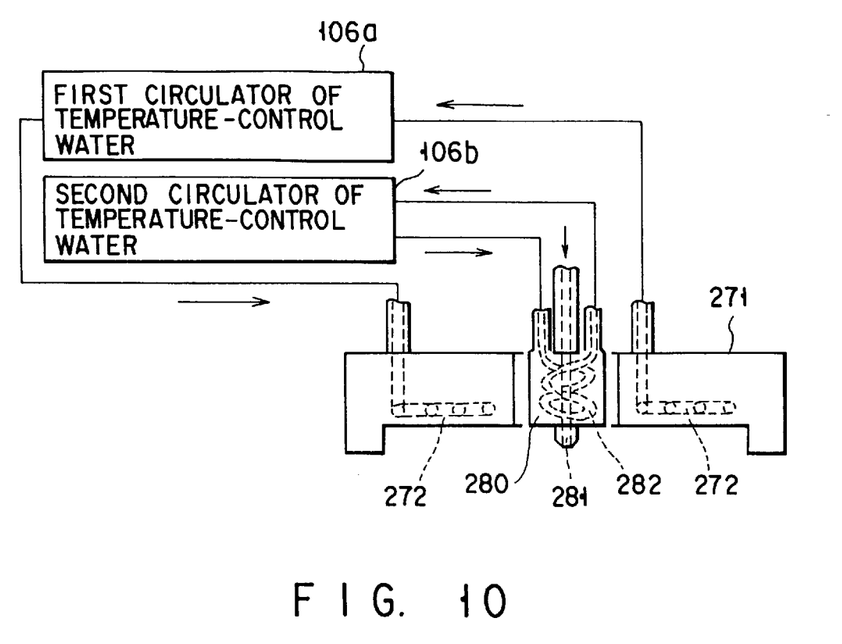
FIG. 10 is a block diagram showing a cover assembly of another embodiment.

Afterwards, a temperature controlled cover 271 is moved downward to position adjacent to the wafer W held on the spin chuck 250. As shown in FIG. 10, since the cover 271 is independent of a nozzle unit 280, their temperatures are individually controlled. More specifically, the inner passage 272 of the temperature controlled cover 271 is communicated with a first temperature controlled water circulation device 106*a*. On the other hand, the inner passage 282 of the nozzle unit 280 is communicated with a second temperature controlled water circulation device 106*b*. The passage of a nozzle 281 is communicated with a tank containing a diluted aqueous solution of hydrofluoric acid (not shown). The aqueous hydrofluoric acid solution supplied from the nozzle 281 is set to a temperature of about 70° C. by a second temperature controlled water circulation device 106*b*.

Figure 11:
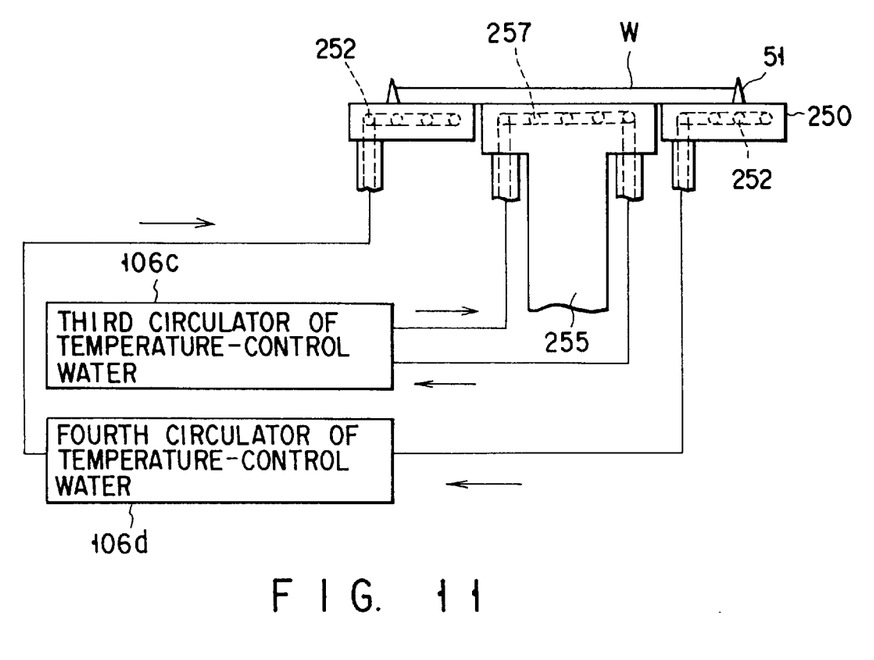
FIG. 11 is a block diagram showing a spin chuck assembly of another embodiment.

As show in FIG. 11, the temperatures of the spin chuck 250 and the lifter 255 in the second washing treatment section 26 are individually controlled. More specifically, the inner passage 257 of the lifter 255 is communicated with a third temperature controlled water circulation device 106*c*. On the other hand, the inner passage 252 of the spin chuck 250 is communicated with a fourth temperature controlled water circulation device 106*d*. The temperature of the wafer W held on the spin chuck 250 is set to about 70° C. by the third and fourth temperature controlled water circulation devices 106*c* and 106*d*.

To the wafer W on the spin chuck 250, the temperature controlled cover 271 is closely positioned. Then, while the water W is being rotated at low speed, a diluted aqueous solution of hydrofluoric acid for use in washing is supplied to the wafer W so as to cover the wafer W. Thereafter, the rotation of the wafer W is terminated to allow the washing solution to be contact with the surface of the wafer W for a predetermined time. In this way, the surface of the wafer W is chemically washed (etched) with the diluted aqueous hydrofluoric acid solution. After completion of the chemical washing, the wafer W is transferred to the washing/drying treatment unit 27, in which the wafer W is rinsed and dried by rotating it at high speed.

The washing completed wafer W is again taken out from the washing/drying treatment unit 27 by the second arm of the main arm 20 and received by the support arm 30 of the wafer transfer section 3 via the shutter 31A. At this point, since the washing completed wafer W is received by the supporting face 30*b* but not by the supporting face 30*a* which supports an untreated wafer W prior to washing, the washing completed wafer W are completely free from particle attachment. Thus, the washing-completed wafer W is housed into the cassette C in the airtight chamber 11 without contamination.

If the wafer W is washed through the steps mentioned above, contaminants such as particles, organic materials, and metal impurities can be removed completely, at the same time, the washing-completed wafer W is kept in a clean state.

As shown in FIG. 12, between a temperature controlled cover 371 and a spin chuck the wafer W, a bearing 340 may be provided. If provided, the temperature controlled cover 371 can be brought into close proximity of the wafer W, enhancing the effect offered by the controlling temperatures of the washing solution supplied from a nozzle 370 and the wafer W.

Figure 13:
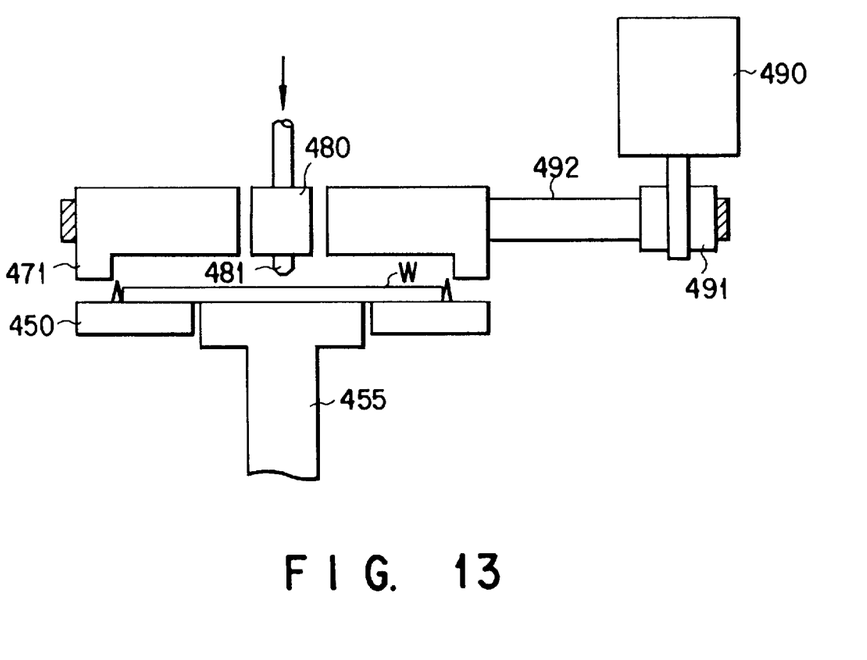
FIG. 13 is a perspective view showing a spin chuck/cover assembly of still another embodiment.

As shown in FIG. 13, a temperature controlled cover 471 and a nozzle unit 480 may be separately provided and the temperature controlled cover 471 may be rotated by means of belt driving mechanisms 490, 491 and 492. In this case, the cover 471 is desirably rotated in synchrony with the spin chuck 450 in substantially the same direction and speed.

According to the apparatus mentioned above, a rising current of spiral air is hardly generated in the area right above the wafer W, so that particles are not involved in a nozzle 481. As a result, clean washing can be attained. The apparatus of this embodiment is effective in washing large-size substrates such as glass substrates for LCDs.

According to the apparatus for washing treatment of the present invention, a substrate can be washed with a washing solution kept at a predetermined temperature. In addition, the washing solution is supplied in a constant amount and washing is carried out in a constant time. As a result, the throughput can be improved and the cost can be reduced.

According to the apparatus for washing treatment of the present invention, the space of the washing treatment section can be divided to use different types of washing solutions (chemical solution). Because of this, each of washing treatment steps can be completely free from contamination of a different atmosphere. As a result, contamination of a substrate with a different atmosphere is successfully prevented, improving the yield of products.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A washing apparatus comprising:

a washing solution supply filled with a washing solution required for chemical washing of a substrate;

a spin chuck for rotatably holding a substrate to be treated;

a nozzle communicating with said washing solution supply for supplying a washing solution from said washing solution supply onto the substrate held on said spin chuck;

solution temperature controlling means for controlling the temperature of the washing solution within a set process temperature range before said washing solution is supplied to the substrate from the nozzle;

a temperature controlling cover;

a cover transfer means for moving said temperature controlling cover close to and away from the substrate held on said spin chuck;

wherein said temperature controlling cover is closely provided by said cover transfer means so as to cover the substrate held on said spin chuck, for controlling the temperature of the washing solution applied onto the substrate so as not to be outside the set process temperature range by the receipt of thermal influence from the ambient atmosphere.

2. The apparatus according to claim 1, further comprising a second temperature controlling means for controlling temperature of said temperature controlling cover.

3. The apparatus according to claim 1, further comprising a second temperature controlling means for controlling the temperature of said spin chuck.

4. The apparatus according to claim 1, further comprising a second temperature controlling means for controlling the temperature of said nozzle.

5. The apparatus according to claim 1, further comprising rinsing means for supplying a rinse solution to a substrate chemically washed.

6. The apparatus according to claim 1, wherein said washing solution supply contains at least one tank having an alkaline washing solution and at least one tank having an acidic washing solution.

7. The apparatus according to claim 1, further comprising a bearing member for bringing said temperature controlling cover into rotatable contact with said spin chuck.

8. The apparatus according to claim 1, further comprising a means for rotating said temperature controlling cover in synchrony with said spin chuck.

9. The apparatus according to claim 1, wherein said temperature controlling cover is provided integrally with said nozzle.

10. The apparatus according to claim 1, wherein said temperature controlling cover is provided separately from said nozzle.

11. The apparatus according to claim 1, further comprising:

transfer means for transferring a substrate; and lifter means for lifting up a substrate from said spin chuck in order to transfer said substrate between said transfer means and said lifter means.

12. The apparatus according to claim 1, wherein a lower peripheral portion of said temperature controlling cover projects downwardly to a position lower than a lower center portion thereof.

13. A washing method comprising:

(a) rotatably holding a substrate on a spin chuck;

(b) placing a temperature controlling cover adjacent to the substrate so as to cover the substrate held on the spin chuck;

(c) controlling said temperature controlling cover and the washing solution at substantially the same temperature within a set process temperature range before use, and supplying said washing solution to the substrate held on spin chuck, thereby performing a chemical washing of the substrate; and (d) separating the substrate held on said spin chuck from the temperature controlling cover.

14. The method according to claim 13, wherein in said step (a), a substrate on said spin chuck is heated to a temperature ranging from 60° C. to 90° C., in said step (b), said temperature controlling cover is heated to a temperature ranging from 60° C. to 90° C., in said step (c), said washing solution is heated to a temperature ranging from 60° C. to 90° C., and said temperature-controlled washing solution is supplied to said temperature-controlled substrate while said temperature controlling cover is positioned adjacent to the substrate.

15. The method according to claim 13, wherein a washing solution is supplied to a substrate while the substrate is being rotated at a first rotation speed, and then the rotation of the substrate is terminated, leaving the substrate in a state of being covered with a washing solution, and further the substrate is rotated at a second rotation speed faster than the first rotation speed to separate the washing solution from the substrate.

16. The method according to claim 13, further comprises rinsing a substrate with a rinse solution while the substrate is rotated together with the spin chuck.

17. The method according to claim 13, wherein said temperature controlled-cover is rotated in synchrony with the spin chuck.

* * * * *